United States Patent

Nakaya

[15] 3,648,068

[45] Mar. 7, 1972

[54] COMPARISON AMPLIFIER

[72] Inventor: Naohisa Nakaya, Tokyo, Japan

[73] Assignee: Iwatsu Electric Co., Ltd., Tokyo, Japan

[22] Filed: May 8, 1969

[21] Appl. No.: 823,078

[30] Foreign Application Priority Data

May 28, 1968 Japan....................................43/36163

[52] U.S. Cl...............................307/228, 307/235, 307/261, 307/317, 328/184

[51] Int. Cl.....................H03k 4/50, H03k 4/78, H03k 5/153

[58] Field of Search..................307/228, 235, 322, 263, 317; 328/184

[56] References Cited

UNITED STATES PATENTS

| | | | |
|---|---|---|---|
| 2,892,952 | 6/1959 | McVey | 307/228 |
| 3,359,429 | 12/1967 | Zimmerman | 307/228 |
| 3,436,560 | 4/1969 | Marchais | 307/322 |

*Primary Examiner*—Donald D. Forrer
*Assistant Examiner*—L. N. Anagnos
*Attorney*—Woodcock, Washburn, Kurtz & Mackiewicz

[57] ABSTRACT

A comparison amplifier includes a transistor whose emitter and base are fed with a comparison voltage and an input signal respectively and whose collector is connected to an output terminal. The emitter of the transistor is connected to signal ground through a diode whose capacitance is smaller than the base-emitter capacitance of the transistor.

8 Claims, 5 Drawing Figures

COMPARISON AMPLIFIER

Field of the Invention

This invention relates to a comparison amplifier in which a first electrode and a control electrode of a transistor are fed with a comparison voltage and an input signal respectively. When the input signal voltage becomes similar to or more than the comparison voltage an output is generated from the output electrode of the transistor.

The Prior Art

In known comparison amplifiers of this kind the signal source supplying the control electrode, as described later, is badly affected by the capacitance and inductance that exist between the control and first electrodes of the transistor and for this reason waveform distortion and linearity are worsened, leading to time deviation in the generation of the output.

Summary and Objects of the Invention

The object of this invention is to provide a simple comparison amplifier in which such problems are overcome.

According to the present invention there is provided a comparison amplifier comprising a comparison voltage source, an output terminal, a transistor having a first electrode connected to the comparison voltage source, a control electrode connected to receive an input signal in the form of an input ramp function and an output electrode connected to the output terminal, and a diode, the first electrode being connected to signal ground through the diode and the diode having a capacitance which is small compared with that exhibited between the control electrode and the first electrode. The transistor remains nonconductive between the first electrode and the output electrode while the comparison voltage rises to a predetermined level and then changes state to become conductive when the control voltage reaches a predetermined level. The small capacitance of the diode minimizes the capacitance between the control electrode and the comparison voltage source thereby improving linearity of the ramp function while the transistor is nonconductive.

The invention will be described in more detail, by way of example, with reference to the accompanying drawings.

Detailed Description of the Illustrated Embodiment

Figure 1:
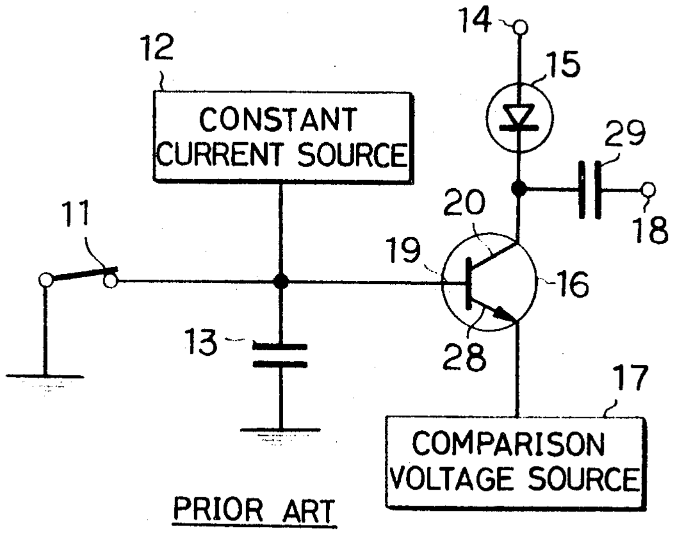
FIG. 1 is a circuit diagram showing a comparison amplifier used in the prior art.

FIG. 1 shows a comparison amplifier used in the prior art. The first electrode or emitter 28 of a NPN-type bipolar transistor 16 is given a comparison voltage V*a* by a comparison voltage source 17 and this comparison voltage V*a* maintains the transistor 16 nonconductive when the base or control electrode 19 is held at ground by closure of a switch 11. Due to this no current passes through a tunnel diode or Esaki diode 15 forming the load at the output electrode or collector and the diode 15 lies in its low-voltage zone.

When the switch 11 is open and after a predetermined time $t$ has elapsed, the ramp function voltage $e$ at the control electrode or base 19 of the transistor 16 rises as expressed in the following formula:

$$e=It/c$$

where $I$ is current fed into a capacitor 13 from a constant current source 12 and $C$ is the capacitance of the capacitor 13.

Figures 3A, 3B:
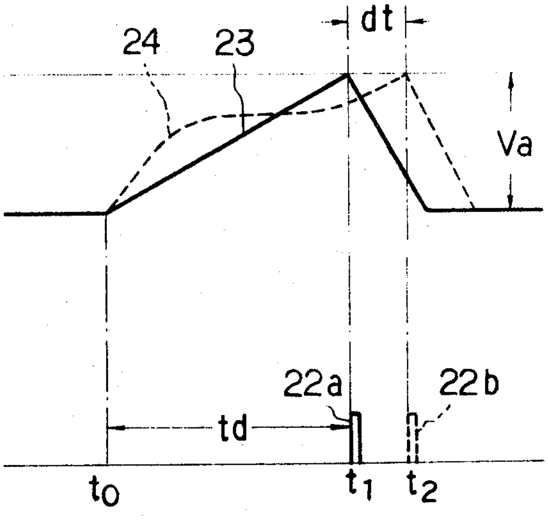
FIGS. 3A and 3B show drawings of the voltage waveforms at the base and output terminal of the comparison amplifier shown in FIG. 1.

When the voltage $e$ rises to and exceeds the predetermined level of the comparison voltage V*a*, the transistor 16 turns to a conductive state between the first electrode and the control electrode and an amplified current I*c* starts to flow to the output electrode or collector 20 of the transistor 16 and when this current I*c* attains the peak current of the tunnel diode 15 this diode 15 is suddenly switched to the high-voltage zone from the low-voltage zone so that a pulse 22*a*, as shown in FIG. 3*b*, is generated at an output terminal 18 through a capacitor 29. In short, when the signal voltage $e$ on the base 19 of the transistor 16 reaches the comparison voltage V*a*, the pulse 22*a* is generated at the output terminal 18.

When the pulse 22*a* is generated it can be used in known manner to control switch-operating means to close the switch 11 automatically. When the switch 11 is thus closed, the tunnel diode 15 and the transistor 16 are safeguarded and the entire circuit resumes its original state.

In order to explain this operating condition more fully, FIGS. 3A and 3B show voltage diagrams for the base 19 and the output terminal 18 of the circuit shown FIG. 1. If it is an ideal comparison amplifier, from the moment the switch 11 is open, the base voltage $e$ of the transistor 16, as shown by curve 23 in FIG. 3A, changes linearly without causing waveform distortion so that the pulse 22*a* is generated as shown in FIG. 3B at the time $t_1$ which is a predetermined time $t_d$ after the switch 11 is opened at $t_0$.

Figure 2:
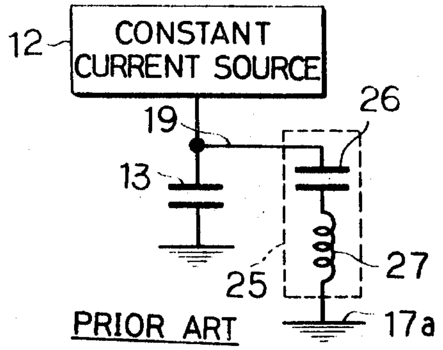
FIG. 2 is an equivalent circuit diagram of the impedance as determined or seen from the constant current source in the circuit shown in FIG. 1.

However, because the input signal sources 12 and 13 to the base 19 of the transistor 16 possess impedance, the capacitance and inductance of the base-emitter path of the transistor 16 are large and the base-emitter resistance of the transistor 16 that exists in a nonconductive state at the beginning is remarkably high, the equivalent circuit of the impedance as determined or seen from the constant current source 12 takes the form shown in FIG. 2.

In the equivalent circuit shown in FIG. 2, the comparison voltage source 17 looks like ground and thus is denoted as ground 17*a*. The base-emitter impedance 25 of the transistor 16 consists of a capacitance 26 and an inductance 27. For this reason the voltage on the base 19 of the transistor 26 is subject to waveform distortion, for example like the curve 24 shown in FIG. 3A, on account the capacitance 26 and the inductance 27 and this kind of waveform distortion affects the circuit action. Hence the pulse 22*a* shown in FIG. 3A becomes delayed or advanced relative to the time $t_1$. E.g., the pulse 22*b* shown in FIG. 3B is generated at the output terminal 18 at $t_2$, increasing the required delay $t_d$ by an error $dt$. In this case when the transistor 16 becomes conductive the base-emitter junction also becomes conductive and the value of the base-emitter resistance is lowered and the waveform distortion becomes attenuated. Even when the transistor 16 is slightly in a conductive state, if given a sharply rising pulse, it also causes an attenuated waveform distortion due to the facts that the frequency component of rise or front portion of this pulse is high and that the base-emitter resistance is still high.

Figure 4:
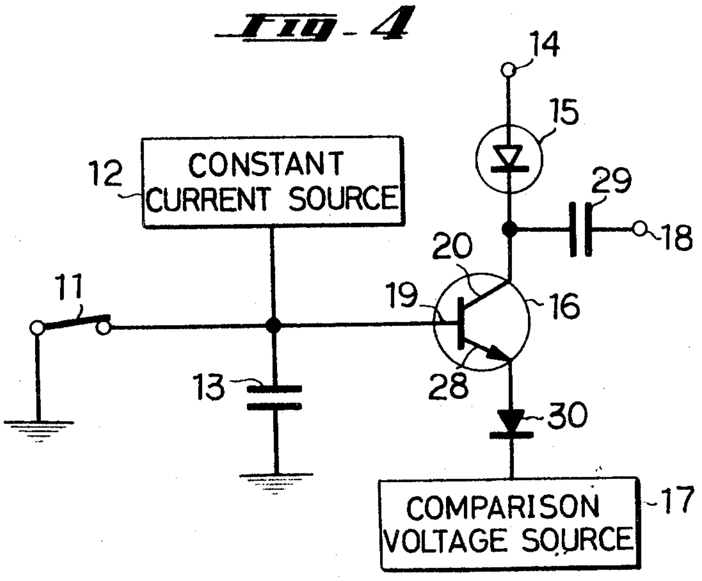
PRIOR ART FIG. 4
FIG. 4 is a circuit diagram of the one embodiment of a comparison amplifier in accordance with this invention.

In this invention this waveform distortion is eliminated or markedly attenuated to improve the linearity. The comparison amplifier whose circuit diagram is illustrated in FIG. 4 has similar structure to that in FIG. 1 with the exception that a diode 30 is connected in series between the emitter 28 of the transistor 16 and the comparison voltage source 17 which appears as signal ground. The diode 30 is connected to be forward biased with the transistor 16 is conductive. The capacitance of the diode 30 is arranged to be smaller than the base-emitter capacitance of the transistor 16 and the inductance of the diode 30 is preferably smaller than the base-emitter inductance of the transistor 16. Hence the diode 30 has superior frequency characteristics to the transistor 16.

In the circuit illustrated in FIG. 4, when the transistor 16 is nonconductive, its capacitance becomes almost the same as that of the diode 30 as the groundlike comparison voltage source 17 is seen from the base 19 through the emitter 28. Due to this, the effects upon the signal that is generated by the constant current source 12 and the capacitor 13 become much smaller and even when the transistor 16 is in a slightly conductive state and the base-emitter resistance is still high the effects get similarly less as in the aforesaid case when given a sharply rising pulse. For this reason the ramp function waveform distortion is attenuated and the linearity is remarkably improved.

In the aforesaid embodiment, an NPN-type is used as the transistor 16 but a PNP-type can also be used. In this case the diodes 15 and 30 are connected the other way round and the polarities of the constant current source 12 and the voltage sources 14 and 17 are arranged oppositely.

The diode 30 was said above to be connected to be forward-biased when the transistor 16 is conductive but if a Zener diode is used as the diode 30, the forward-biased connection is not always necessary and instead a reverse biased connection can be employed.

As bipolar transistor, such as planer transistor, may be used as the transistor 16 but a unipolar transistor such as field effect transistor can also be used instead.

Although the illustrated embodiments of this invention have been described in detail above with reference to the accompanying drawings, it is to be understood that this invention is not limited to those precise embodiments and that various changes and modifications may be effected therein by one skilled in the art without depending from the scope or spirit of the invention as defined in the appended claims.

What is claimed is:

1. In a comparison amplifier comprising a comparison voltage source, an input signal source generating an input ramp function, an output terminal, and a transistor having a first electrode connected to the said comparison voltage source, a control electrode connected to said input signal source for providing a control voltage at said control electrode comprising said ramp function, and an output electrode connected to said output terminal, said transistor being nonconductive between said first electrode and said output electrode while said control voltage rises to a predetermined level with respect to said comparison voltage and changing state to become conductive between said first electrode and said output electrode when said control voltage reaches said predetermined level, the improvement residing in a diode connecting said first electrode to said comparison voltage source, the diode having a capacitance which is small as compared with that exhibited between said control electrode and said first electrode of said transistor so as to minimize the capacitance between said control electrode and said comparison voltage source thereby improving the linearity of said ramp function while said transistor is nonconductive between said first electrode and said output electrode and before the change of state of said transistor.

2. A comparison amplifier according to claim 1, wherein the diode has a smaller inductance than the inductance exhibited between the control electrode and the first electrode of the transistor.

3. A comparison amplifier according to claim 1, wherein the transistor is a bipolar transistor.

4. A comparison amplifier according to claim 3, wherein the output electrode is the collector of the transistor and is connected to a voltage source through a tunnel diode as well as to the output terminal.

5. A comparison amplifier according to claim 1, wherein the control electrode is the base of the transistor, and said input signal source comprises a constant current source, a capacitor and a switch being connected to the base and the switch being connected to ground.

6. A comparison amplifier according to claim 5, wherein a capacitor is connected between the collector of the transistor and the output terminal, the collector being the output electrode.

7. A comparison amplifier according to claim 1, wherein the first said diode is connected to be forward-biased when the transistor is conductive.

8. A comparison amplifier according to claim 1, wherein the signal ground is constituted by the comparison voltage source.

* * * * *